United States Patent [19]
Hsiao et al.

[11] Patent Number: 5,986,912
[45] Date of Patent: Nov. 16, 1999

[54] COMPACT ASSEMBLY CONFIGURATION AND PROCESS FOR REDUCING LEAD WIRE CONNECTIONS AND SOLDER JOINTS

[75] Inventors: Ko-Yu Hsiao; Kuen-Feng Chen; Kai-Hung Huang, all of Taoyuan Shien, Taiwan

[73] Assignee: Delta Electronics Inc., Taipei, Taiwan

[21] Appl. No.: 09/218,656

[22] Filed: Dec. 22, 1998

[30] Foreign Application Priority Data

Jul. 3, 1998 [TW] Taiwan ................................. 87110813

[51] Int. Cl.$^6$ ..................................................... H02M 1/00
[52] U.S. Cl. ................................. 363/147; 363/17; 363/89
[58] Field of Search ................................. 363/17, 147, 89, 363/127, 132

[56] References Cited

U.S. PATENT DOCUMENTS 5,544,038  8/1996  Fisher et al. ............................. 363/147

Primary Examiner—Shawn Riley
Attorney, Agent, or Firm—Bo-In Lin

[57] ABSTRACT

The present invention discloses an electronic device for rectifying input electric signals to generate rectified output signals. The electronic device includes an input inductive circuit includes an input conductive winding-trace for receiving the input electric signals. The electronic device further includes a rectifying integrated circuit (IC) chip directly soldered onto to the winding-trace for processing the input electric signals provided for generating the rectified output signals. In another preferred embodiment, the input inductive circuit is an input one-turn inductive circuit further includes a top core and a bottom core for generating inductive input signals responding to the input electric signals. In another preferred embodiment, the electronic device further includes an output circuit connected to the IC chip wherein the output circuit further includes output inductive circuit for generating inductive output signals in response to the rectified output signals. In another preferred embodiment, the output inductive circuit is an output one-turn inductive circuit further includes an output top core and an output bottom core for generating the inductive output signals.

20 Claims, 7 Drawing Sheets

COMPACT ASSEMBLY CONFIGURATION AND PROCESS FOR REDUCING LEAD WIRE CONNECTIONS AND SOLDER JOINTS

BACKGROUND OF THE INVENTION

1. Field of the Invention

This invention relates generally to the structure and method of assembling a compact electronic device. More particularly, this invention relates to a new configuration and assembling process for manufacturing compact electronic assemblies with reduced lead-wire connections and solder joints to achieve improved operational power supply efficiency with better thermal performance and meanwhile achieving improved assembly reliability.

2. Description of the Prior Art

As many discrete components are interconnected by lead wires, which are soldered at solder joints to form the power supply systems, the power utilization efficiency and packing density are degraded when the number of solder joints are increased. In addition to the problems caused by interconnecting these discrete components by lead wires, the packaging configuration for each of these discrete components also involves the use of lead frame and wire bonding, which also requires solder joints. The difficulties of efficiency degradation and greater volume assemblies occupying larger space are compounded because of these packaging and assembling configurations.

Referring to FIG. 1A for a circuit diagram of a forward converter commonly employed in a switching power supply (SPS). An induced current is generated and inputted to a inductor winding 12 from a secondary winding 101 via a transformer 10. A set of rectifiers 111 and 112 then rectify the induced current to generate the output DC current to an output circuit (not shown) connected between a positive terminal (Vo) and a negative terminal (–Vo). The rectifiers 111 and 112 can either be a diode or a metal-oxide-semiconductor field effect transistor (MOSFET). FIG. 1B is a circuit diagram of an alternate forward converter arranged slightly differently than that of FIG. 1A.

Referring to FIG. 2 for a perspective view of a packed MOSFET 111 according to conventional packaging process. A MOSFET die 21 is connected by bonding wires 241 and 242 to a source lead 231 and a gate lead 233 respectively provided on a lead frame. The MOSFET power transistor 21 is supported on a copper tap 22. A drain of the power MOSFET is formed on the bottom surface of the substrate of the die 21 and is connected via the copper tab 22 to the lead 232. The MOSFET rectifier 111 is enclosed and protected in an epoxy molding 25. This packaged MOSFET rectifier 111 is then employed as a component and further assembled as part of the forward converter of FIGS. 1A or 1B, according to FIG. 3 as explained below.

FIG. 3 is a cross sectional view of an electronic assembly connected between a positive terminal +Vo and a negative terminal –Vo for implementing a circuit as that shown in FIG. 1B. One end of the secondary winding 101 is connected to the Copper trace 311 on the printed circuit board through solder joint 321. The source lead 231 of the MOSFET 111 is connected to the Copper trace 311 through solder joint 322. Wire bonding 241 is exploited to connect source lead 231 and MOSFET die 242. The MOSFET die 21 is attached to the copper tab 22 through joints 323 and the copper tab 22 is supported and attached to a second copper trace 312 on the printed circuit board via joints 324. One end of inductor winding is connected to the copper trace 312 through solder joint 325. The other end of inductor winding 12 is connected to the positive terminal +Vo. According to the configuration of assembly shown above, there are multiple joints, i.e., solder joints 321, 322, 323, 324, and 325 composed of Sn62%/Pb36%Ag2%. For a power supply, these multiple joints electrically function as resistors and power losses at these joints significantly reduce the operational efficiency of the power supply systems. For a forward converter with regular size, an assembly as that shown in FIG. 3 results in a total resistance of approximately 875 micro-ohms. Since the power loss is proportional to the resistance and the square of current, i.e., I2R, for a power supply operated with higher current, the power loss becomes a significant design problem that cannot be overcome because of the configuration of assembly that involves so many interconnecting solder joints.

In addition to the problem of the power loss, the packing density of the power supply system is also adversely affected. The packing density is a function of the size of the components and the distance between the components. In a switching power supply system of high power density, there are multiple rectifiers arranged in parallel to increase the efficiency. The connecting traces connected between these joints thus occupy large percentage of the packaging space. As a conventional forward converter requires so many solder joints, the packing density cannot be easily reduced.

Therefore, an improved packaging and assembling configuration is still required to simplify the structure and interconnections of these discrete components. This simplified structure must be able to reduce the number of joints while providing stable and reliable interconnections. It is further desirable that the improved configuration can be carried out in mass production processes that can be conveniently automated to further reduce the production cost of the assembled systems.

SUMMARY OF THE PRESENT INVENTION

It is therefore an object of the present invention to provide a novel configuration and assembling process for interconnecting components for an assembled system for reducing the interconnecting lead wires and solder-joints such that the aforementioned limitations and difficulties encountered in the prior art can be overcome.

Specifically, it is an object of the present invention to provide a novel configuration and assembling process for interconnecting components for an assembled system by directly mounting electronic chips not-yet-packaged directly to conductive board for direct connecting to electric circuits formed on the copper straps. The conductive may be a copper strap. The lead-wires that required for interconnecting the components and the corresponding solder joints for these lead wires are reduced.

Another object of the present invention is to provide a novel configuration and assembling process for interconnecting components for an assembled system by directly mounting electronic chips not-yet-packaged directly to conductive boards for direct connecting to electric circuits formed on the conductive boards. The manufacture processes are simplified and more reliable assemblies are achieved because the lead-wires required for interconnecting the components and that the corresponding solder joints for these lead wires are both reduced.

Another object of the present invention is to provide a novel configuration and assembling process for interconnecting components for an assembled system by directly mounting electronic chips not-yet-packaged directly to conductive boards for direct connecting to electric circuits formed on the conductive boards. The assemblies manufactured with the novel configuration can be conveniently reduced in size and volume and achieve better form factors because the lead-wires required for interconnecting the components and that the corresponding solder joints for these lead wires are both reduced.

According to the present invention, a compact electronic device is disclosed for carrying out an AC to DC conversion. The compact electronic device includes a winding, an electronic die integrated to the winding, and an output circuit electrically connected to the die. Compared to conventional switching power supply systems, power loss is significant reduced because the input current transmitted to the winding is now configured to flow directly to the electronic die without connected through additional solder joints.

Briefly, in a preferred embodiment, the present invention discloses a forward converter for a switching power supply system (SPS). The forwarder converter includes a first and a second MOSFET power transistors. The forward converter further includes a secondary winding copper strap serving as an input for the forward converter and an inductor winding copper strap. The first MOSFET power transistor is disposed with a drain directly on the secondary winding copper strap. The second power MOSFET is disposed with a drain directly on the inductor winding. A source of the first and a second MOSFET power device is connected to an output terminal. Thus the MOSFET power transistor dies are mounted directly on copper straps employed as inductor windings to reduce interconnecting solder joints.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 4:
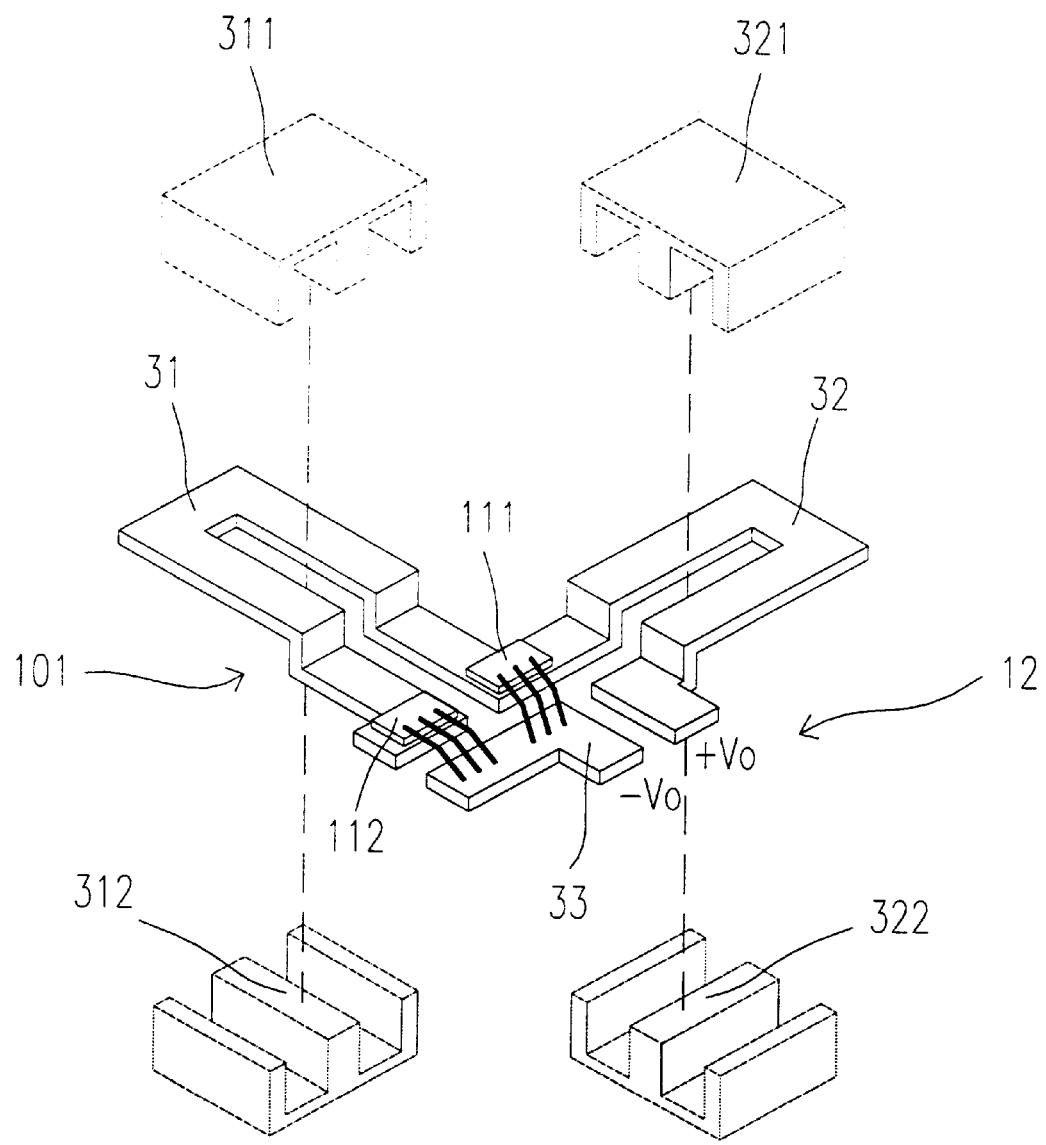
FIG. 4 is an exploded perspective view of components provided for assembling into a forward converter of FIG. 1 according to a structure of this invention.

Referring to FIG. 4 for an exploded view of the output stage of a forward converter assembly according to the configuration disclosed in this invention. This forward converter is assembled with a compact assembly configuration. Instead of connecting several pre-packaged discrete components with lead wires, a totally new assembling technique is disclosed. The forward converter according to this new configuration includes a secondary winding structured by placing an upper and a lower core 311 and 312 respectively over a first copper strap winding 31. The forward converter further includes an output inductor winding structured by placing an upper and a lower core 321 and 322 respectively over a second copper strap winding 32. The secondary winding 101 supports a first MOSFET power transistor die 112 with a drain of the transistor placed directly on the copper strap winding 31. The inductor winding 12 supports a second MOSFET power transistor die 111 with a drain of the transistor placed directly on the copper strap winding 32. The source terminals of the rectifying MOSFET chips 111 and 112 are wire bonded to an output terminal 33 connected to an negative output terminal −Vo with the copper strap winding 32 of the inductor winding 12 connected to a positive terminal +Vo.

Figure 1A:
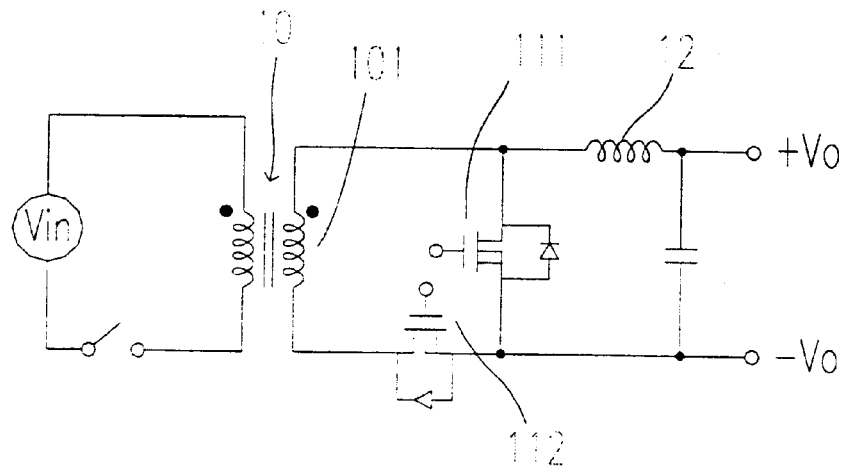
FIGS. 1a and 1B are circuit diagrams for two alternate forward converters employed in a switching power supply (SPS)
Figure 1B:
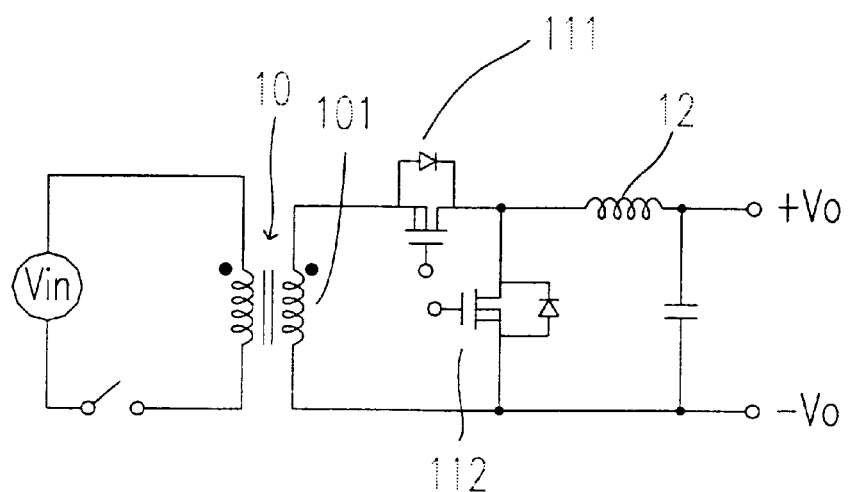
Figure 2:
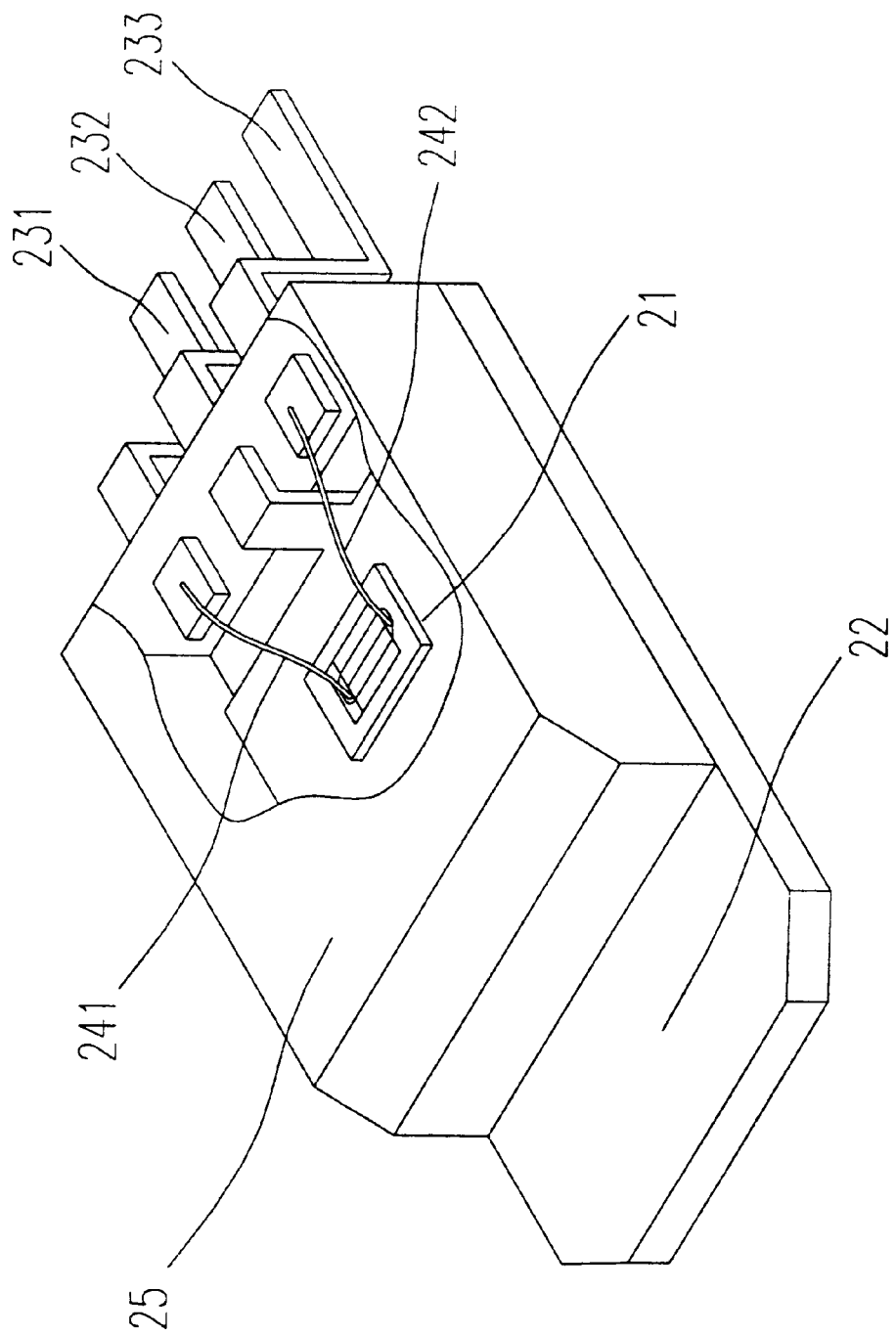
FIG. 2 is a perspective view of a packaged power MOSFET transistor with a source lead, a gate lead and drain lead commonly used in a conventional power supply system.
Figure 3:
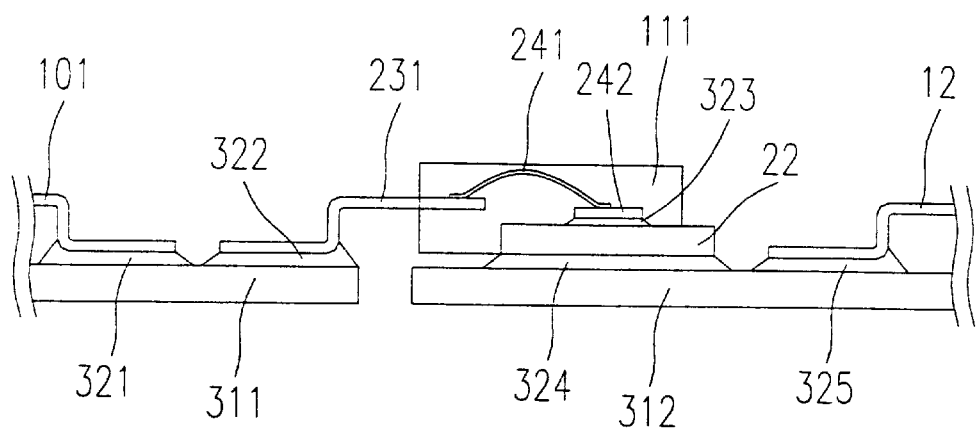
FIG. 3 is a cross sectional view showing the joints of interconnections to construct a circuit as shown in FIG. 1A implemented with a power MOSFET transistor of FIG. 2.
Figure 5:
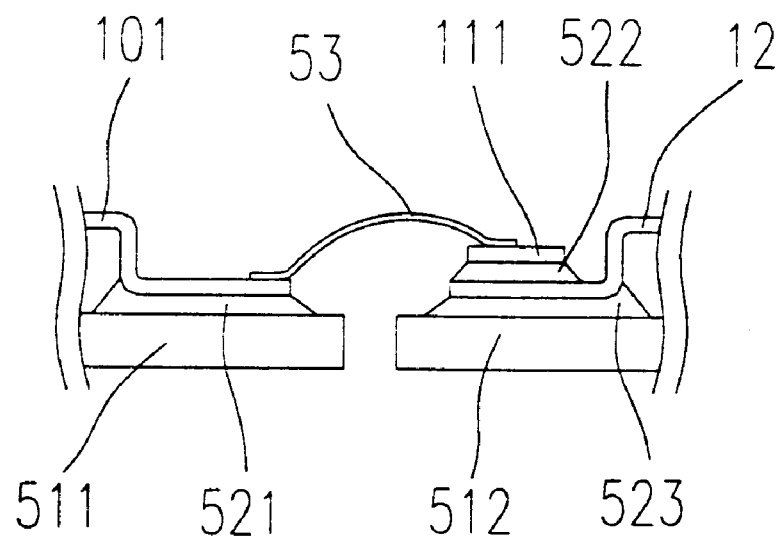
FIG. 5 is a cross section view showing the structure and joints of connection for an assembly arranged according to a configuration as shown in FIG. 4.

FIG. 5 is a side cross sectional view of a forward converter configured according a structure of the present invention by implementing a forward converter assembled according to FIG. 4 (from:FIG.4 to:FIG. 1(B)). The MOSFET 111 is connected to copper winding 12, which is part of the output inductor through solder joint 522. The source of MOSFET 111 is connected to Copper winding 111, which is part of transformer secondary winding 101. The output current flows through 101, 53, 111, 522 and 12. In this case, solder-pads 512 and 513 and solder-joints 521 and 523 do not introduce any resistance to the current path, so the efficiency will be optimized. The assembly has a resistance approximately $165\mu\Omega$ that is significantly lower than the resistance of a prior art package, e.g., less than one-fifth of the resistance $875\mu\Omega$ of a package of prior art forward converter.

Figure 6A:
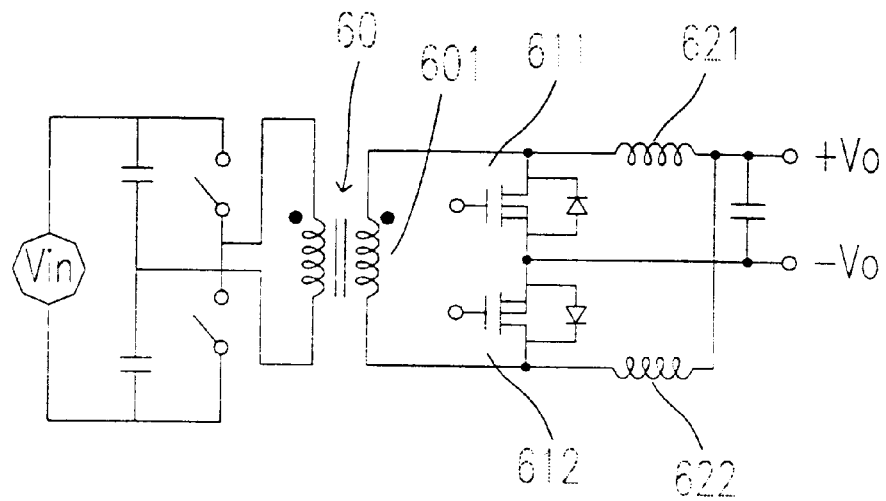
FIGS. 6A and 6B are circuit diagrams of two half-bridge converters used in switching power supply system.
Figure 6B:
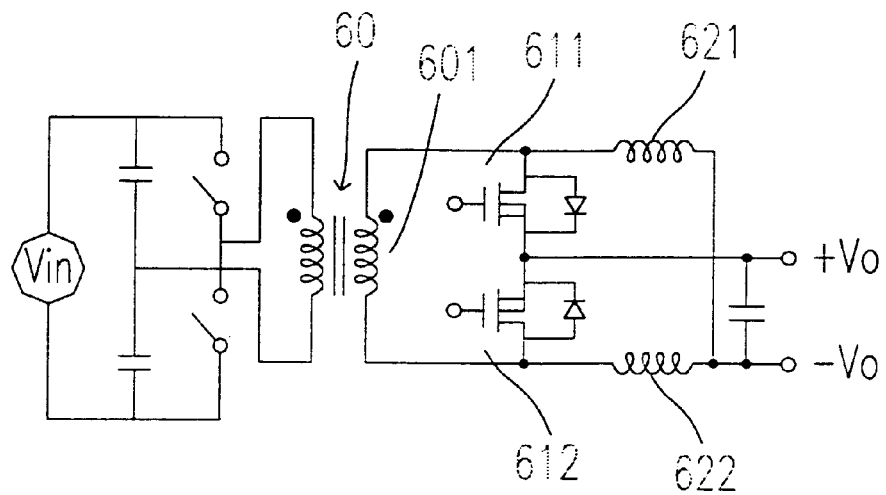

The configuration as that shown in FIG. 4 and the assembling process as that shown in FIG. 5 can be applied to various kinds of electric devices that have windings and semiconductor chips. Another example of application are shown in FIGS. 6A and 6B which are circuit diagrams of two different half bridges converters usually used in switching power supply system (SPS). Either metal oxide semiconductor field effect transistors (MOSFETs) or diodes can be used as the rectifiers designated with numeral designations of 611 and 612. FIG. 6B shows a different arrangement of rectifiers included in FIG. 6A while the functions performed are similar.

Figure 7:
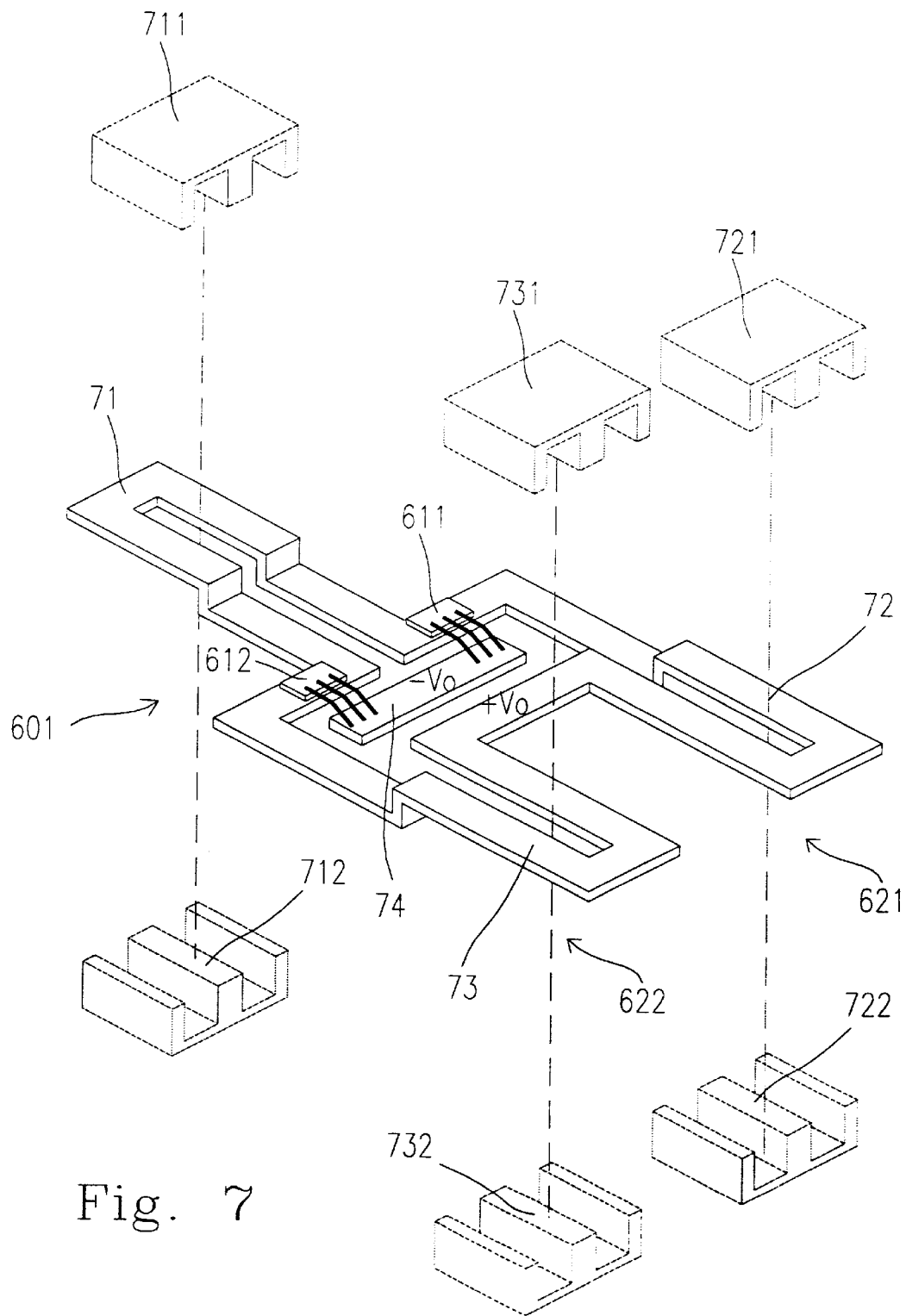
FIG. 7 is an exploded perspective view of components provided for assembling into a forward converter of FIG. 6A according to a structure of this invention.

FIG. 7 is an exploded view of pre-assembled components for assembling into the output stage of a half-bridge converter as that shown in FIG. 6A. Instead of using the pre-packaged rectifiers as that usually implemented in the prior art, the rectifiers 611 and 612 are direly soldered to the windings 71, 72, and 73. Varieties of solders such as solders Sn63%Pb37%, Sn60%Pb40%, Sn62%Pb36%Ag2%, Sn96.5%Ag3.5%, and Pb92.5%Sn5%Ag2% can be applied. Again, similar to that shown and discussed for FIG. 4, the copper winding 71, top core 711 and bottom core 712 form the one turn transformer secondary winding 601 in FIG. 6(A). The Copper winding 72, top core 721 and bottom core 722 form the one turn inductor 621 in FIG. 6(A). The Copper winding 73, top core 731 and bottom core 732 form the one turn inductor in FIG. 6(A). The unidirectional diode dice or the bi-directional MOSFET transistor dice 611 and 612 are also electrically connected to the junction between 71 and 72, and between 71 and 73 respectively as the rectifiers.

According to the drawings and above description, this invention discloses an electronic device for rectifying input electric signals to generate rectified output signals. The electronic device includes. The electronic device further includes a rectifying integrated circuit (IC) chip(s) directly soldered onto to the winding-trace for processing the input electric signals provided for generating the rectified output signals. In another preferred embodiment, the input inductive circuit is an input one-turn inductive circuit further includes a top core and a bottom core for generating inductive input signals responding to the input electric signals. In another preferred embodiment, the electronic device further includes an output circuit connected to the IC chip wherein the output circuit further includes output inductive circuit for generating inductive output signals in response to the rectified output signals. In another preferred embodiment, the output inductive circuit is an output one-turn inductive circuit further includes an output top core and an output bottom core for generating the inductive output signals. In a preferred embodiment, the input conductive winding-trace is a metal strip with metallic coating selected from a group consisting of nickel, gold and soldering metals. In yet another preferred embodiment, the rectifying integrated circuit (IC) chip is an unidirectional diode having an anode and a cathode wherein the cathode is soldered to the input conductive winding trace. In a different embodiment, the rectifying integrated circuit (IC) chip is a bi-directional metal-oxide-semiconductor field effect transistor (MOSFET) having a source and a drain with the drain directly soldered to the input conductive winding trace. In another preferred embodiment, the rectifying integrated circuit (IC) chip is a bi-directional metal-oxide-semiconductor field effect transistor (MOSFET) having a source and a drain with the source directly soldered to the input conductive winding trace. This invention also discloses a power supply system. The power supply system includes a rectifier for rectifying input electric signals to generate rectified output signals. The rectifier further includes an input inductive circuit includes an input conductive winding-trace for receiving the input electric signals. And, the rectifier further includes a rectifying integrated circuit (IC) chip directly soldered onto to the winding-trace for processing the input electric signals provided for generating the rectified output signals.

In summary, this invention discloses an electronic device having an inductive circuit and an integrated circuit (IC) chip. The inductive circuit includes a conductive winding-trace. And, the IC chip directly mounted on the conductive winding-trace. In a preferred embodiment, the inductive circuit further includes a top core disposed above the conductive winding-trace and a bottom core disposed below the conductive winding-trace to form a one-turn inductor. In another preferred embodiment, the electronic device further includes an output inductive circuit, connected to the inductive circuit, includes an output conductive winding-trace. And, the output inductive circuit further includes an output top core disposed above the output conductive winding-trace and an output bottom core disposed below the output conductive winding-trace to form a one-turn output inductor.

The assembling and packaging processes are simplified by using the integrated circuit (IC) chip directly without requiring a pre-packaged unit as that commonly employed in the prior art. The soldering processes are reduced by directly mounting the IC chips on the copper windings implemented as part of inductors. The need for using copper tab and lead wires is also eliminated such that the resistance is greatly reduced and power utilization efficiency is significantly improved. Furthermore, the size of the assembly is reduced because different components are more densely integrated. The device structure and assembling configuration are particularly useful for high power density SPS.

Therefore, the present invention discloses a novel configuration and assembling process for interconnecting components for an assembled system for reducing the interconnecting lead wires and solder-joints such that the limitations and difficulties encountered in the prior art are overcome. Specifically, a novel configuration and assembling process for interconnecting components for an assembled system is provided by directly mounting electronic chips not-yet-packaged directly to conductive traces for direct connecting to electric circuits formed on the conductive straps. The conductive straps may be a copper strap. The lead-wires that required for interconnecting the components and the corresponding solder joints for these lead wires are reduced. The manufacture processes are simplified and more reliable assemblies are achieved because the lead-wires required for interconnecting the components and that the corresponding solder joints for these lead wires are both reduced. The assemblies manufactured with the novel configuration can be conveniently reduced in size and volume and achieve better form factors because the lead-wires required for interconnecting the components and that the corresponding solder joints for these lead wires are both reduced.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. An electronic device for rectifying input electric signals to generate rectified output signals comprising:

an input inductive circuit includes an input conductive winding-trace for receiving said input electric signals;

a rectifying integrated circuit (IC) chip directly soldered onto said winding-trace for processing said input electric signals provided for generating said rectified output signals.

2. The electronic device of claim 1 wherein:

said input inductive circuit is an input one-turn inductive circuit further includes a top core and a bottom core for generating inductive input signals responding to said input electric signals.

3. The electronic device of claim 1 further comprising:

an output circuit connected to said IC chip wherein said output circuit further includes output inductive circuit for generating inductive output signals in response to said rectified output signals.

4. The electronic device of claim 3 wherein:

said output inductive circuit is an output one-turn inductive circuit further includes an output top core and an output bottom core for generating said inductive output signals.

5. The electronic device of claim 3 further comprising:

an output circuit connected to said IC chip wherein said output circuit further includes output inductive circuit for generating inductive output signals in response to said rectified output signals.

6. The electronic device of claim 1 wherein:

said input conductive winding-trace is a metal strip with metallic coating selected from a group consisting of nickel, gold and soldering metals.

7. The electronic device of claim 1 wherein:

said rectifying integrated circuit (IC) chip is an unidirectional diode having an anode and a cathode wherein said cathode is soldered to said input conductive winding trace.

8. The electronic device of claim 1 wherein:

said rectifying integrated circuit (IC) chip is a bi-directional metal-oxide-semiconductor field effect transistor (MOSFET) having a source and a drain with said drain directly soldered to said input conductive winding trace.

9. The electronic device of claim 1 wherein:

said rectifying integrated circuit (IC) chip is a bi-directional metal-oxide-semiconductor field effect transistor (MOSFET) having a source and a drain with said source directly soldered to said input conductive winding trace.

10. A power supply system comprising:

a rectifier for rectifying input electric signals to generate rectified output signals;

said rectifier further includes an input inductive circuit includes an input conductive winding-trace for receiving said input electric signals;

said rectifier further includes a rectifying integrated circuit (IC) chip directly soldered onto to said winding-trace for processing said input electric signals provided for generating said rectified output signals.

11. The power supply system of claim 10 wherein:

said input inductive circuit is an input one-turn inductive circuit further includes a top core and a bottom core for generating inductive input signals responding to said input electric signals.

12. The power supply system of claim 10 wherein:

said rectifier further includes an output circuit connected to said IC chip wherein said output circuit further includes output inductive circuit for generating inductive output signals in response to said rectified output signals.

13. The power supply system of claim 12 wherein:

said output inductive circuit is an output one-turn inductive circuit further includes an output top core and an output bottom core for generating said inductive output signals.

14. An electronic device having an inductive circuit and an integrated circuit (IC) chip wherein:

said inductive circuit includes a conductive winding-trace; and said IC chip directly mounted on said conductive winding-trace.

15. The electronic device of claim 14 wherein:

said inductive circuit further includes a top core disposed above said conductive winding-trace and a bottom core disposed below said conductive winding-trace to form a one-turn inductor.

16. The electronic device of claim 14 further comprising:

an output inductive circuit, connected to said inductive circuit, includes an output conductive winding-trace; and said output inductive circuit further includes an output top core disposed above said output conductive winding-trace and an output bottom core disposed below said output conductive winding-trace to form a one-turn output inductor.

17. A method for assembling an electronic device with an inductive circuit and an integrated circuit (IC) chip wherein:

(a) forming said inductive circuit with a conductive winding-trace; and (b) directly mounted said IC chip on said conductive winding-trace.

18. The method of claim 17 wherein:

said step (a) in forming said inductive circuit further includes a step of placing a top core above said conductive winding-trace and placing a bottom core below said conductive winding-trace to form a one-turn inductor.

19. The method of claim 18 further comprising steps of:

(c) forming an output inductive circuit with an output conductive winding-trace and connecting said output inductive circuit to said inductive circuit, and (d) placing an output top core above said output conductive winding-trace and placing an output bottom core below said output conductive winding-trace to form a one-turn output inductor.

20. The method of claim 17 wherein:

said step (b) in directly mounting said IC chip on said conductive winding-trace is a step of soldering said IC chip directly onto said winding-trace.

* * * * *